United States Patent
Autry

(10) Patent No.: US 8,058,719 B2
(45) Date of Patent: Nov. 15, 2011

(54) INTEGRATED CIRCUIT WITH FLEXIBLE PLANER LEADS

(75) Inventor: Tracy Autry, Trabuco Canyon, CA (US)

(73) Assignee: Microsemi Corporation

( * ) Notice: Subject to any disclaimer, the term of this patent is extended or adjusted under 35 U.S.C. 154(b) by 403 days.

(21) Appl. No.: 11/728,624

(22) Filed: Mar. 27, 2007

(65) Prior Publication Data

US 2008/0237827 A1 Oct. 2, 2008

Related U.S. Application Data

(60) Provisional application No. 60/919,794, filed on Mar. 23, 2007.

(51) Int. Cl.
*H01L 23/48* (2006.01)

(52) U.S. Cl. ... 257/688; 257/669; 257/692; 257/E23.01; 257/E23.04; 174/525; 361/718

(58) Field of Classification Search ............... 257/688, 257/669, 690, E23.034, E23.039, E23.055, 257/528, 692, 693, 700, 734, 735, 784, E23.01, 257/E23.023, E23.031; 174/525, 527, 533, 174/544, 554; 361/717, 718
See application file for complete search history.

(56) References Cited

U.S. PATENT DOCUMENTS

| | | | | |
|---|---|---|---|---|
| 3,721,867 | A * | 3/1973 | Schierz | 257/688 |
| 5,045,921 | A | 9/1991 | Lin et al. | |
| 5,528,079 | A | 6/1996 | McIver | |
| 6,054,759 | A * | 4/2000 | Nakamura | 257/691 |
| 6,486,544 | B1 * | 11/2002 | Hashimoto | 257/686 |
| 6,876,069 | B2 * | 4/2005 | Punzalan et al. | 257/676 |
| 6,909,176 | B1 * | 6/2005 | Wang et al. | 257/706 |
| 7,217,997 | B2 * | 5/2007 | Wyland | 257/707 |
| 7,391,153 | B2 * | 6/2008 | Suehiro et al. | 313/512 |
| 7,462,933 | B2 * | 12/2008 | Zhao et al. | 257/713 |
| 7,586,758 | B2 * | 9/2009 | Cady et al. | 361/803 |
| 2004/0112424 | A1 * | 6/2004 | Araki et al. | 136/256 |
| 2005/0037258 | A1 | 2/2005 | Itoh et al. | |
| 2005/0180113 | A1 * | 8/2005 | Shirakami et al. | 361/704 |

FOREIGN PATENT DOCUMENTS

| | | |
|---|---|---|
| DE | 2 253 627 | 5/1974 |
| EP | 0 512 742 A1 | 11/1992 |
| WO | WO 89/10005 | 10/1989 |

OTHER PUBLICATIONS

Int'l Search Report and Written Opinion, Jun. 23, 2008, EPO.

* cited by examiner

*Primary Examiner* — Evan Pert
*Assistant Examiner* — Eduardo A Rodela
(74) *Attorney, Agent, or Firm* — Robert C. Klinger

(57) ABSTRACT

A microelectronic device including a microelectronic circuit and at least one planar flexible lead. These planar flexible leads are adapted to bend and flex during mechanical stress allow direct mounting of the device to a member, and withstand extreme thermal cycling, such as −197° C. to +150° C. such as encountered in space.

19 Claims, 3 Drawing Sheets

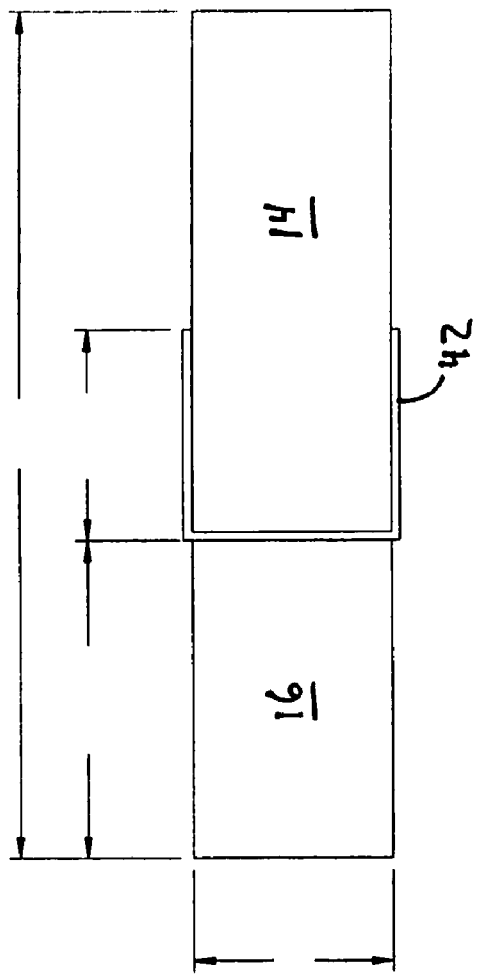
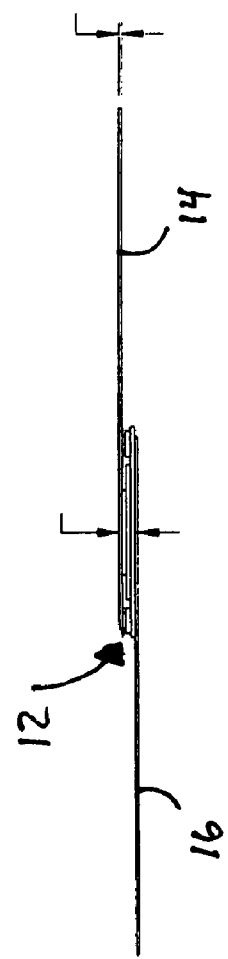
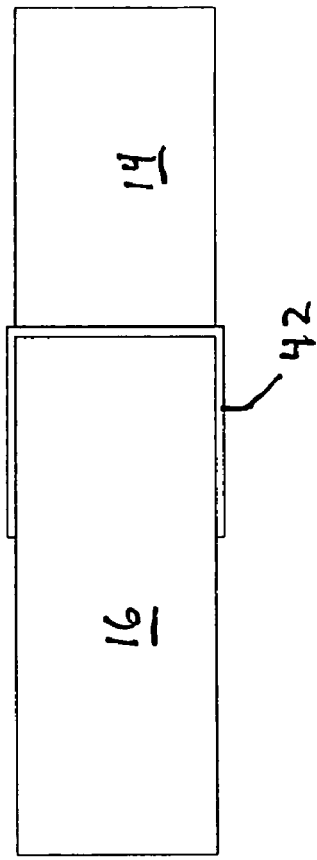
FIGURE 4
FIGURE 5
FIGURE 6

INTEGRATED CIRCUIT WITH FLEXIBLE PLANER LEADS

PRIORITY CLAIM

This application claims priority of U.S. Provisional Ser. No. 60/919,794 entitled "Integrated Circuit with Flexible Planer Leads" filed Mar. 23, 2007.

FIELD OF THE INVENTION

The present invention is generally directed to integrated circuits, and more particularly to integrated circuit packages including diodes that are adapted to withstand extreme thermal cycling, such as that incurred in a space environment, such as solar panels.

BACKGROUND OF THE INVENTION

Microelectronic devices typically comprise of an integrated circuit diode die encompassed in a package having a plurality of external leads permitting electrical attachment to a printed circuit board. These microelectronic devices are available as commercial devices, and some are available as high reliability devices such as used in military applications, including those integrated in space environments, such as satellites, space vehicles and solar panels. In space environments, microelectronic devices need to withstand extreme thermal cycling, such as from −197 C. to +150 C.

All materials have a coefficient of thermal expansion, which is a thermal index indicating the relative degree a material expands or contracts as a function of temperature. Materials contract as they are cooled, and expand as they are warmed. Therefore, microelectronic devices employ materials with similar coefficients of thermal expansion that they can withstand extreme thermal cycling. Portions of the device having similar coefficients of thermal expansion are secured to one another using adhesive, paste, solder and so forth to avoid separation during thermal cycling.

In space applications, one typical integrated circuit includes a solar cell diode which may be joined to a solar cell panel. These solar cell diodes are subject to some of the most severe thermal cycling environments given their exposure to the sun and subsequent shading therefrom numerous times over their life cycle. Conventionally, these solar cells devices are comprised of glass and are soldered or welded to the solar panel, and interconnected to other circuits using rigid materials, such as rigid axial leads. These rigid leads can tolerate the extreme thermal cycling for a period of time, but have a limited life cycle. These axial leaded devices were designed for solder attachment to the solar panel. The solder joint in this design has limited thermal cycling capability due to thermal expansion mismatch, solder re-crystallization, and solder creep. Cracking it the solder joint is then followed by an electrical disconnect with the circuit.

More recently, solar panel manufacturers have switched to attaching the axial leaded devices using a welded connection. The axial leads do not lend themselves to welding easily. Solar panel manufactures struggle with the weld attachment. Welding flat leads to round axial leads causes reliability and weld consistency problems. An easier more reliable method is desired.

Integrated circuits generate heat during operation due to conduction losses. This heat must be dissipated from the device for proper functioning. Axial leaded glass diodes in particular are very difficult to heat sink to the panel and remove the heat efficiently. Solar panel manufactures have been struggling with thermal problems associated with the axial leaded glass diodes. A device that can be more efficiently heat sunk is desired.

There is desired an improved microelectronic device adapted to withstand extreme thermal cycling, such as that encountered in a space environment.

SUMMARY OF INVENTION

The present invention achieves technical advantages as a microelectronic device including a microelectronic circuit and a planar flexible lead. The planar flexible lead is adapted to bend and flex during mechanical stress and during extreme temperature cycling, and allow direct mounting of the device to a member by easily welding or soldering.

BRIEF DESCRIPTION OF THE DRAWINGS

FIG. 4 is a top view of one illustrative example with dimensions;

FIG. 5 is a side view of the illustrative example in FIG. 4; and

FIG. 6 is a bottom view of the illustrative example in FIG. 4.

DETAILED DESCRIPTION OF THE PRESENT INVENTION

Figure 1:
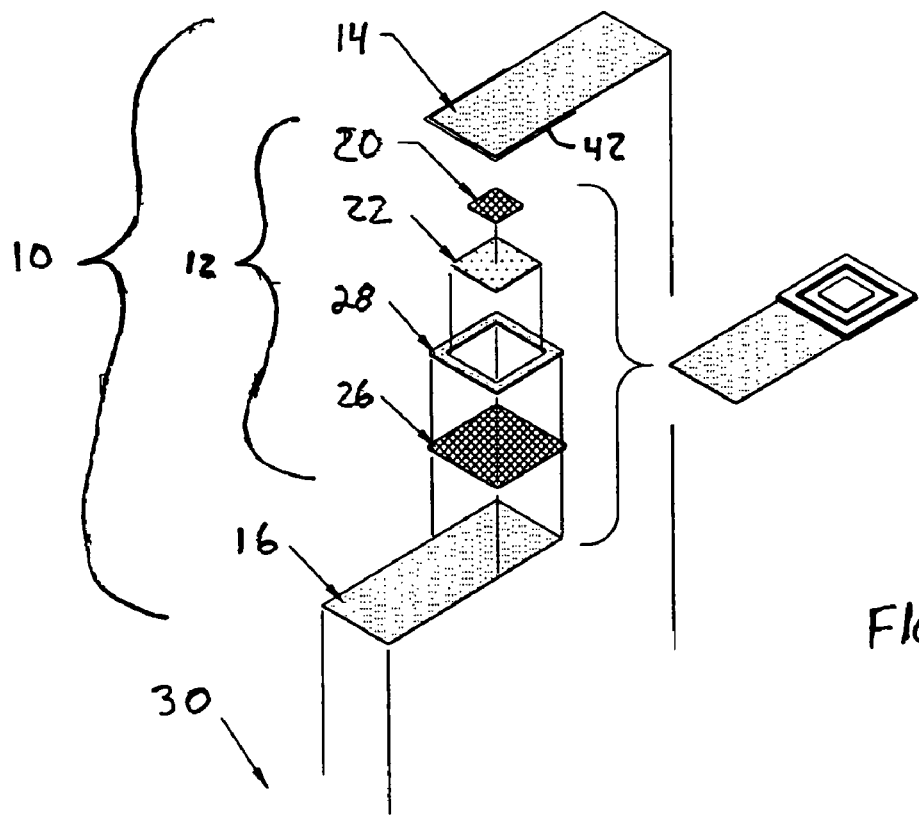
FIG. 1 is an exploded perspective view of a microelectronic package having a planar flexible lead according to one embodiment of the invention.

Referring to FIG. 1, there is generally shown at 10 a microelectronic device seen to include an integrated circuit assembly 12 interposed between a pair of planar flexible leads 14 and 16. The integrated circuit assembly 12 is seen to comprise a microelectronic circuit 22, such as a die, disposed upon a moly substrate 26, which substrate 26 is secured upon the flex lead 16, as shown. A ring 28 is formed upon the substrate 26, and forms a die attach cavity 38 configured to receive the microelectronic, (FIG. 3).

Advantageously, the planar flexible leads 14 and 16 are each formed as a thin sheet such as they are configured to flex, particularly during mechanical stress and during extreme thermal cycling. The planar flexible leads 14 and 16 may be formed as a membrane, but may have other shapes and profiles, and have an electrically conductive portion permitting electrical signals to pass from the die 22 to another member coupled to the respective flexible lead 14 or 16. According to one embodiment of the present invention, the entire flexible lead 14 and 16 is comprised of a thin planar sheet of an electrically conductive member, such as a metal or metal alloy, such as copper, gold or silver, although other materials are possible and within the scope of the present invention. In another embodiment, the flexible lead can be comprised of an electrically conductive member formed on another material, such as a backing member. In one preferred embodiment, the thickness of the flexible lead 14 and 16 is 3 mils, but may have a thickness of up to 30 mil, depending on the desired electrical and thermal conductivity of the material, the desired flexibility, and compliance in its intended environment. The microelectronic device may be received in and tested in a test fixture shown.

Figure 2:
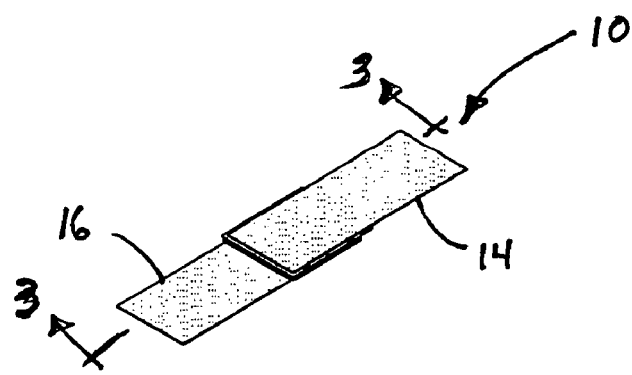
FIG. 2 is a perspective view of the microelectronic package of FIG. 1.

Referring now to FIG. 2, there is shown the assembled microelectronic device 10 seen to include the collinear planar flexible leads 14 and 16 configured to sandwich the assembly 12 between respective ends thereof.

Figure 3:
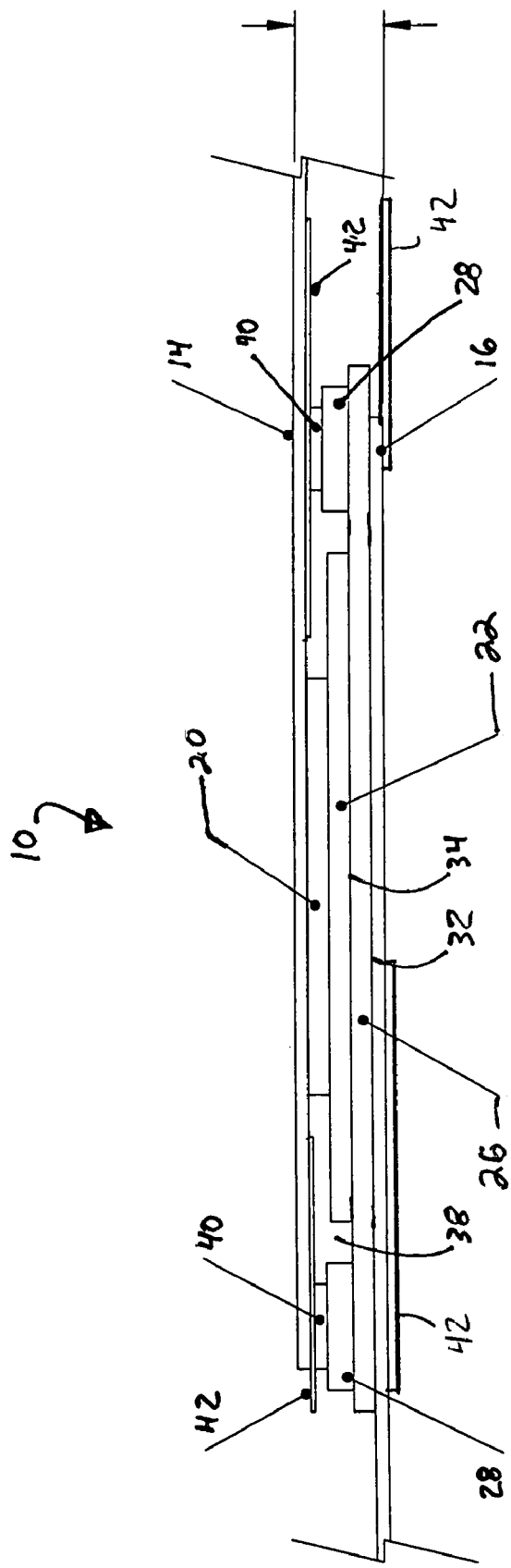
FIG. 3 is a cross sectional view taken along line 3-3 in FIG. 2.

Referring now to FIG. 3, there is shown a cross sectional view of the device 10 taken along line 3-3 in FIG. 2. The substrate 26 is seen to have a lower major surface 32 secured to a top surface of the lower flexible lead 16, such as by brazing, welding, electrically conductive adhesive, or other well known techniques used to join an integrated circuit base to an electrode. The substrate 26 is also seen to have an upper major surface 34 having secured thereon substrate die 22, secured thereto by brazing, soldering, or an electrically conductive paste. Joined to the top surface of the die 22 is seen a top member 20, similar to substrate 26, and configured to provide mechanical support to the die 22. Substrate 26 and upper member 20 also provide one or more electrical path from the circuit of die 22 to the respective planar flexible leads 14 and 16. Annular ring 28 is seen to be secured about the perimeter of die 22 and forms the die attach cavity 38 about the die 22, as shown. Ring 28 functions as a mechanical buffer between the integrated circuit chip 22 the lower end 16 to isolate the mechanical stress in the lead 16 from the integrated circuit chip 22. An annular cap member 40 is seen to be disposed upon a surface of the ring 28. Cap member 40 is coupled to the top planar flexible lead 14 by an annular member 42, such as a 1 mil thick layer of kapton, although other materials are suitable as well, to form a hermetic seal. The ring 28 is preferably comprised of an alloy, such as alloy 42, and member 40 is comprised of a metal, such as copper, having a similar thermal coefficient of expansion. Substrate 26 and upper member 20 are preferably comprised of molybdenum, although other materials are suitable for the base and upper member. All the members of device 10 have very similar, coefficient of thermal expansion such that the members are not overly strained or compressed with respect to one another during extreme thermal cycling. In the embodiment shown in FIG. 3, the die 22 may have a thickness of 5 mil, and the flexible leads 14 and 16 may have a thickness of 3 mil.

On critical limitation is the thickness of the flexible leads 14 and 16. It is advantageous that the planar flexible lead 14 and 16 be comprised of a suitable material and have a suitable thickness such that it has enough mechanical strength to secure the assembly 12 to another member, such as directly to a solar panel, yet which is thin enough to achieve flexibility to withstand mechanical stress, such as during a solar panel deployment in orbit without degradation or tearing. Therefore, it is desired that the planar flexible leads have a thickness of no greater than about 30 mil, however, limitation to this exact dimension is not to be inferred.

The planar flexible leads 14 and 16 may form ribbon lead which may be bent or even twisted if necessary during attachment to a recipient member, such as a solar cell panel, or during use. The planar flexible leads achieve technical advantages over conventional rigid axial leads in that these planar leads are adapted to be weldable, which is the preferred method of attachment for devices experiencing extreme thermal cycling, such as that needed in the space environment. Axial leads are not ideally suitable for welding.

Although one preferred embodiment of the flexible planar leads 14 and 16 is an electrically conductive material, such as a metal, alloy or other material, these leads may be comprised of more than one material, such as multilayer members comprised of same or different materials if desired. For instance, the leads may be comprised of two planar members joined along their major surfaces, or even a strip of a first material upon a planar second material. Therefore, limitation to a planar flexible lead comprised of a single material is not to be inferred.

The die 22 may comprise of a solar diode, and may also comprise of other integrated circuit designs if desired, such as an amplifier, sensor, or other electrical devices. In the case of a diode, the upper flexible lead 14 may be connected to the anode, and the lower flexible lead 16 may be connected to the cathode of the diode. The assembly 12 may be hermetically sealed, or semi-hermetically sealed if desired. All materials used in the device 10 meet space outgassing regulations, and also pass automatic oxygen exposure regulations. The device 10 is scaleable in size to fit most any die size. The device 10 is flat and very low profile due to its planar design, further facilitating the device to be directly mounted to a solar panel as desired. Various silicon diode chips may be used in the package, and may be usable for blocking applications and by-pass applications. The device is also suitable for use with the new flex solar cell panels currently deployed in space. The device can be heatsunk directly to the solar panel for solar management. Advantageously, the die junction is protected from sunlight reducing reverse leakage power loss. Large dies may also be used to provide lower Vf since less heat is generated. Schottky dies can also be used for extremely low Vf applications. The device can withstand $-197°$ C. (liquid nitrogen), and up to $+150°$ C. such as a liquid.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A microelectronic device, comprising:
   a substrate having an upper major surface and a lower major surface;
   an integrated circuit disposed upon the substrate upper major surface; and
   a first planar flexible lead coupled to and substantially covering the substrate lower major surface, the first planar flexible lead comprising a foil extending away from the integrated circuit to a free end and adapted to route an electrical signal, further comprising a ring disposed upon the substrate and encompassing the integrated circuit.

2. The microelectronic device as specified in claim 1 wherein the first planar flexible lead is configured to provide stress relief to the substrate.

3. The microelectronic device as specified in claim 1 wherein the first planar flexible lead has an electrically conductive planar portion.

4. The microelectronic device as specified in claim 3 wherein the planar portion is comprised of a metallic material.

5. The microelectronic device as specified in claim 1 wherein the first planar flexible lead has a thickness of no greater than about 30 mil.

6. The microelectronic device as specified in claim 1 wherein the first planar flexible lead is configured to be weldable.

7. The microelectronic device as specified in claim 1 wherein the substrate comprises an electrically conductive portion disposed between the integrated circuit and the first planar flexible lead.

8. The microelectronic device as specified in claim 1 wherein the integrated circuit is a die.

9. The microelectronic device as specified in claim 1 wherein the integrated circuit is a diode.

10. The microelectronic device as specified in claim 1 wherein the substrate comprises molybdenum.

11. The microelectronic device as specified in claim 1 wherein the first planar flexible lead is comprised of a copper, gold or silver material.

12. A microelectronic device, comprising:
- a substrate having an upper major surface and a lower major surface;
- an integrated circuit disposed upon the substrate upper major surface; and
- a first planar flexible lead coupled to and substantially covering the substrate lower major surface, the first planar flexible lead comprising a foil extending away from the integrated circuit to a free end and adapted to route an electrical signal, further comprising a second planar flexible lead coupled to a top portion of the integrated circuit, wherein the second planar flexible lead substantially covers the integrated circuit, and the first planar flexible lead and the second planar flexible lead are configured to sandwich the integrated circuit.

13. The microelectronic device as specified in claim 12 wherein the second planar flexible lead is comprised of a foil.

14. The microelectronic device as specified in claim 12 further comprising a member disposed between the integrated circuit and the second planar flexible lead.

15. The microelectronic device as specified in claim 14 wherein the first planar flexible lead, the second planar flexible lead and the member encapsulate the integrated circuit.

16. The microelectronic device as specified in claim 14 wherein the member comprises an electrically conductive portion interconnected between the integrated circuit and the second planar flexible lead.

17. The microelectronic device as specified in claim 14 wherein the member is coupled to the substrate.

18. The microelectronic device as specified in claim 14 further comprising a ring coupled to the substrate and disposed about the integrated circuit, and being disposed between the substrate and the member.

19. The microelectronic device as specified in claim 18 further comprising an integrated circuit cavity disposed about the integrated circuit.

* * * * *